United States Patent [19]

Pengue, Jr.

[11] Patent Number: 4,616,189

[45] Date of Patent: Oct. 7, 1986

[54] GALLIUM ARSENIDE DIFFERENTIAL AMPLIFIER WITH CLOSED LOOP BIAS STABILIZATION

[75] Inventor: M. Louis Pengue, Jr., Portland, Oreg.

[73] Assignee: TriQuint Semiconductor, Inc., Beaverton, Oreg.

[21] Appl. No.: 727,487

[22] Filed: Apr. 26, 1985

[51] Int. Cl.[4] .......................... H03F 3/16; H03F 3/45
[52] U.S. Cl. .................................. 330/253; 330/258; 330/261; 330/277
[58] Field of Search ............... 330/253, 256, 258, 259, 330/261, 277, 307

[56]  References Cited

U.S. PATENT DOCUMENTS

| 4,371,843 | 2/1983 | Fang et al. | 330/258 X |
| 4,393,315 | 7/1983 | Stickel et al. | 307/264 |
| 4,528,515 | 7/1985 | Gross | 330/254 |
| 4,528,516 | 7/1985 | Hill | 330/254 |

OTHER PUBLICATIONS

Costlow, Terry, "GaAs Yields Denser RAM, Gate Arrays, and Hybrids Analog Chips", *Elec. Design,* Sep. 20, 1984, p. 61 only.

*Primary Examiner*—Eugene R. LaRoche
*Assistant Examiner*—Steven J. Mottola
*Attorney, Agent, or Firm*—John D. Winkelman; William S. Lovell; Alex C. Johnson, Jr.

[57] ABSTRACT

A gallium arsenide differential amplifier is compensated against temperature and process induced variations so as to provide phase and amplitude matched differential output signals centered about an internal GaAs reference voltage. Compensation of the amplifier is effected by one or more current sources which are adjustably responsive to the dynamic common mode level of the output signals. The resultant amplifier provides a high common mode rejection ratio and facilitates implementation of otherwise impracticable differential GaAs circuit topologies.

19 Claims, 5 Drawing Figures

GALLIUM ARSENIDE DIFFERENTIAL AMPLIFIER WITH CLOSED LOOP BIAS STABILIZATION

TECHNICAL FIELD

This invention relates generally to the interface of logic signals to gallium arsenide circuits, and more particularly to the implementation of a compensated gallium arsenide differential amplifier for use in such interface circuits.

BACKGROUND OF THE INVENTION

Gallium arsenide (GaAs) technology is advancing rapidly in research laboratories, but has been slow to gain acceptance in commercial applications. Two factors contribute to the reluctance of system designers to incorporate GaAs components in their products: the difficulties of interfacing GaAs components with the silicon bipolar circuitry presently in widespread use, and the limited range of integrated circuit components presently available in GaAs.

The difficulties of interfacing GaAs components with silicon bipolar circuitry stem from the different logic voltage levels required by the different integrated circuit families. Emitter Coupled Logic (ECL), for example, is a high-speed bipolar technology which typically operates at a reference, or common mode level of −1.29 or −1.33 volts and has output swings of 500 millivolts above and below this level. Three-Diode Buffered FET Logic (BFL), one of the GaAs logic families, operates at a reference level of −0.5 volts and has output swings of 1 volt above and below this level.

The translation of logic signals from one such logic family to the other is complicated by the different temperature-response characteristics of the two materials. The reverse saturation current of a silicon diode junction, for example, doubles for every 10° C. rise in temperature. The forward voltage drop across a silicon junction drops 20 millivolts over the same range. Compensation for these temperature related effects is comparatively easy in a wholly silicon based system, since all the circuitry behaves similarly. When a GaAs circuit is interfaced through a translator circuit with a silicon circuit, however, the temperature drift of the silicon generated logic levels will not match the temperature drift of the GaAs logic levels. The translated silicon levels can thus drift away from the desired GaAs levels, causing the system performance to become marginal. Accordingly, proper temperature stabilization of silicon to GaAs translator circuits is an obstacle that must be overcome before GaAs components can enjoy widespread commercial acceptance.

The second factor slowing commercial acceptance of GaAs technology is the limited range of GaAs integrated circuits presently available. This limited range of components can be traced, in part, to the inherent difficulties of implementing certain circuit topologies satisfactorily in GaAs. Differential amplifiers, for example, have been widely used in the silicon integrated circuitry art as building blocks in components such as latches, shift registers and digital-to-analog converters. Optimization of such circuits in GaAs, however, is made difficult by the many problems inherent in GaAs technology which are not present with silicon. Some of these problems include: the inherently low gain of GaAs transistors, the difficulties of fabricating large value resistors and high impedance current sources, the poor matching of adjacent GaAs components, the wide process variations in the pinch-off voltage of GaAs field effect transistors (GaAsFETs) and the dependence of GaAsFET drain currents on their drain to source voltages. Such factors make any symmetrical circuit topology, such as the differential amplifier, difficult to implement in GaAs. Consequently, GaAs circuits which rely on symmetrical topologies, such as logic families that use phase matched differential inputs or outputs, are unavailable.

In response to the interfacing problem, many designers have proposed circuits for translating bipolar ECL logic signals to gallium arsenide compatible levels. One such circuit is shown in FIG. 1. A reference voltage, corresponding to the common mode level of an input ECL signal, is generated by the forward voltage drop across a diode string and is applied to the source of an input GaAsFET. As the input signal swings around the reference voltage, the input GaAsFET will alternately turn on and off, providing an inverted, amplified output signal on its drain. This signal is applied to the gate of a second GaAsFET and serves to turn it on and off. The output voltage on the source of the second GaAsFET is dropped by a second diode string to the desired output voltage level, at which point it is connected to the GaAs circuit being driven.

Circuits such as this, which rely on diodes as reference voltage sources, are highly dependent on a precise ambient temperature for proper operation. In FIG. 1, for example, the voltage at the reference node of the input GaAsFET and the voltage dropped by the output diode string will both be functions of temperature. Such circuits also suffer from the drawback that the diode-established reference voltages will vary with changes in forward current and are subject to process induced variations. Lastly, the required reference voltage must be a multiple of the nominal diode voltage drop. Such fortuitous situations are uncommon and are difficult to force.

An input translator circuit used by Honeywell is discussed in the "IEEE Journal of Solid State Circuits," Vol. SC-19, No. 1, February 1984, page 10. The Honeywell circuit uses a reference voltage which is set by the ratio of the component GaAsFET gate widths. Such a scheme is highly dependent on the pinch-off voltages of the GaAsFETs used. These pinch-off voltages are again functions of ambient temperature, changing at the rate of −1 millivolt per °C., and are further subject to process induced variations of up to 600 millivolts.

An input circuit for Capacitively Coupled Logic (CCL) developed by Bell Telephone Manufacturing Company, Antwerp, Belgium, is disclosed in the "IEEE Journal of Solid State Circuits," Vol. SC-18, No. 3, June 1983, page 359. The amplifier uses a pair of GaAsFETs in a nominally differential configuration. Both of the inputs, however, are capacitively coupled by back-biased diodes. The text of the article indicates that one of the inputs can be used as a reference node and tied to the drain voltage supply. The use of a DC voltage on a capacitively coupled input node, as taught by the reference, causes one of the inputs of the nominally differential pair to float. The differential feature is thus disabled and the circuit operates as a single-ended amplifier. Furthermore, if the circuit were modified to enable differential operation, the outputs would not switch symmetrically about a center, common mode voltage. The absence of a symmetrical output swing, however, does not affect operation of the circuit, as described, because only a single output is used.

An input level translator circuit used by GigaBit Logic is discussed in the "IEEE Technical Digest" from the 1984 GaAs IC Symposium, page 11. An external temperature compensation circuit designed for use with the GigaBit's translator circuit is shown in "Applications Brief 1: Power Supply Requirements for Giga-Bit's 10G Picobit Logic Family."

The GigaBit level translator is built about an inverting GaAsFET stage. The circuit's switching threshold voltage is set by the ratio of the inverting GaAsFET's gate width to the gate width of a pull-up GaAsFET. The input ECL signal is voltage shifted to be centered about the circuit's switching theshold.

The level shifting of the ECL input signal down to the circuit's switching threshold is effected by a string of series diodes between the ECL input and the gate of the inverting GaAsFET. The voltage drop provided by this series diode string may be varied slightly by varying the forward current passing through the diodes. This forward current is varied by changing a trim voltage that biases the diodes. The trim voltage is provided by a comparator circuit that compares an externally generated ECL reference voltage with an externally generated GaAs reference voltage.

The GigaBit Applications Brief indicates that the temperature compensation circuit is only effective over a 15° C. temperature range. The circuit is not compensated for process variations in the widths of the inverting and pull-up GaAsFET gates. Nor is the circuit compensated for process variations in the voltage dropping diodes. Finally, the trim voltage that "tweaks" the level translating circuit is externally generated and may not have the same temperature or process characteristics as the ECL and GaAs circuits with which the translator is being used.

In sum, the prior art discloses no fully-compensated or self-compensated GaAs translator circuits. Furthermore, all translator circuits currently being used provide poor temperature stability and are dependent on critical manufacturing and processing tolerances. Lastly, the prior art does not disclose any compensated GaAs differential voltage amplifiers.

SUMMARY OF THE INVENTION

It is an object of the present invention to provide a compensated GaAs differential voltage amplifier circuit.

It is a further object of the present invention to provide a compensated GaAs differential amplifier circuit having a high common mode rejection ratio.

It is yet a further object of the present invention to provide a feedback circuit for a GaAs differential amplifier which will maintain the symmetrical, differential character of the output voltage swings about a common mode signal and will minimize variations of the common mode signal.

It is yet a further object of the present invention to provide a silicon-to-GaAs level translator circuit having temperature compensation.

It is yet another object of the present invention to provide a silicon-to-GaAs level translator circuit having compensation for process variations.

It is yet another object of the present invention to provide a fully compensated GaAs level translator circuit having differential inputs and outputs.

The circuit of the present invention is a GaAsFET differential voltage amplifier having closed loop bias stabilization. The inputs and outputs can be used differentially or single-endedly. A common mode voltage is derived from the output signals and is fed back to the differential amplifier to vary the current through the GaAsFETs. This feedback loop minimizes variations of the common mode signal and maintains the symmetrical, differential relationship of the output voltages relative to the internal GaAs reference voltage. As taken from a differential source, that feedback loop then provides a "true" common mode signal, and provides a phase and amplitude matched differential output.

The foregoing and additional objects, features and advantages of the present invention will be more readily apparent from the following detailed description of a preferred embodiment thereof, which proceeds with reference to the accompanying drawings.

DETAILED DESCRIPTION

Diode Based Translator Circuit

Figure 1:
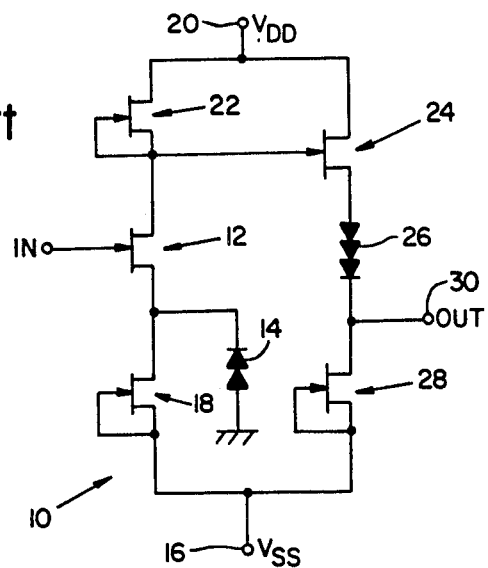
FIG. 1 is a schematic diagram of an uncompensated GaAsFET input translator circuit.

The level translator circuit 10 of FIG. 1 has been proposed to translate silicon bipolar logic levels to GaAs logic levels. The bipolar input signals are applied to the gate of a depletion mode GaAsFET 12. GaAsFET 12 acts as a threshold switching device, turning on and off as the voltage on its gate swings above and below a reference voltage applied to its source terminal.

The reference voltage applied to the source terminal of GaAsFET 12 is set by the forward voltage drop across diode string 14, comprised of two series connected GaAs diodes. The source of GaAsFET 12 is also coupled to a $V_{SS}$ supply 16 of $-3.0$ volts through a current source 18. Current source 18 comprises a GaAsFET with its gate and source shorted and connected to $V_{SS}$ supply 16. The drain of current source 18 is connected to the source of GaAsFET 12.

The drain of GaAsFET 12 is coupled to a $V_{DD}$ supply 20 of approximately 4.0 volts through a GaAsFET 22. GaAsFET 22 is configured as an active load, with its gate tied to its source and to the drain of GaAsFET 12. The drain of GaAsFET 22 is tied to $V_{DD}$ supply 20.

The output signal from the drain of GaAsFET 12 provides an input signal to the gate of a GaAsFET 24. The drain of GaAsFET 24 is tied directly to $V_{DD}$ supply 20. The source of GaAsFET 24 drives a series diode string 26 of three GaAs level shifting diodes. This string is further connected in series with a GaAsFET 28 configured as a current source, with its gate connected to its source and $V_{SS}$ supply 16, and with its drain being connected to diode string 26. The output 30 of translator circuit 10 is taken from the drain of GaAsFET 28.

The input voltage level at which GaAsFET 12 will switch is dependent on the reference voltage provided by series diode string 14. The voltage across diode string 14 is selected to match the common mode, or reference voltage of the input signal, typically −1.29 or −1.33 volts for ECL. As the input signal swings above and below this threshold voltage, GaAsFET 12 will alternately turn on and off, producing a voltage swing on its drain terminal. This signal is fed to the gate of GaAsFET 24 and serves to modulate the current passing from its drain to its source. The signal on the source of GaAsFET 24 is stepped down three GaAs forward diode voltage drops before being provided to output terminal 30.

Although level translator circuit 10 works satisfactorily in the laboratory, practical considerations render it unsuitable for commercial applications. The reference voltage set by diode string 14 and the level shift voltage set by diode string 26 are each dependent on three factors: the ambient temperature, the forward current and the processing variations. A 1° C. rise in the ambient temperature will reduce the forward voltage drop across each GaAs diode by approximately 1 millivolt. A 25 microamp reduction in forward current will change the voltage drop by a like amount. The process related variations in forward voltage drops may exceed 50 millivolts between adjacent diodes. By connecting two or more GaAs diodes in series, these problems are compounded. Accordingly, the circuit of FIG. 1 is unsuitable for all but the most carefully controlled conditions.

The compensated differential pair of the present invention, when incorporated into a input level translator circuit as next described, overcomes these difficulties.

Compensated Input Translator Circuit

Functional Overview

Figure 2:
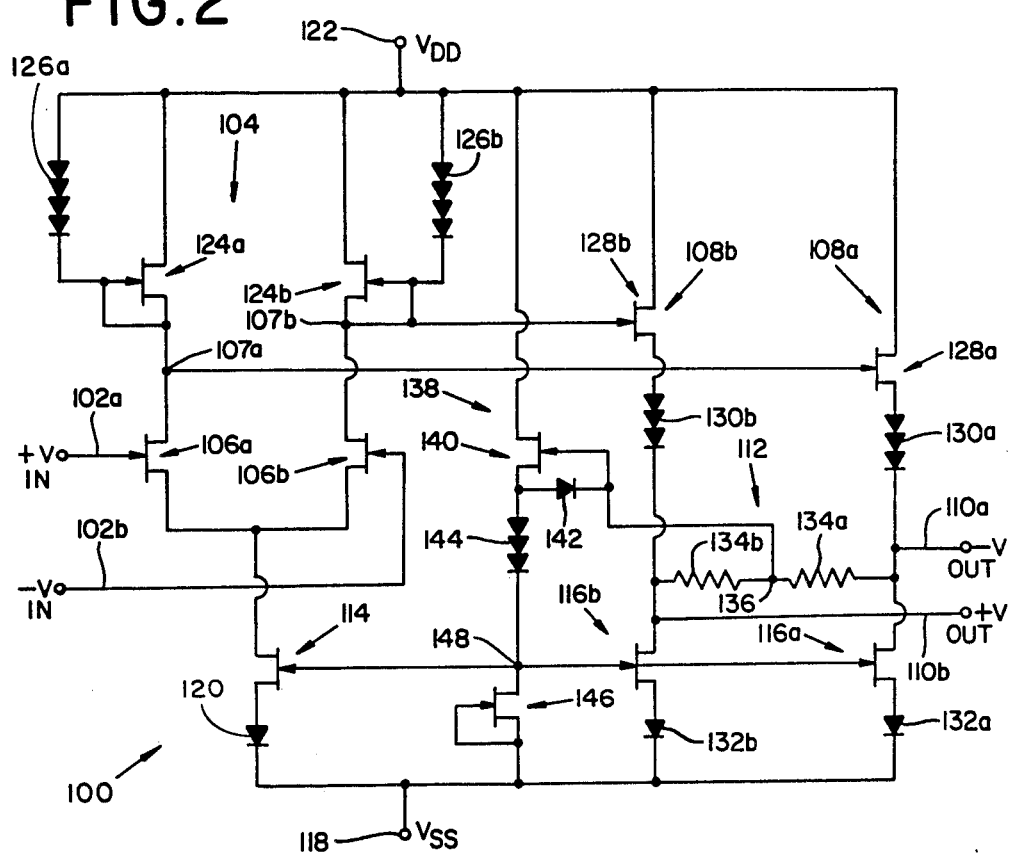
FIG. 2 is a schematic diagram of a compensated differential GaAsFET input translator circuit according to the present invention.

An input level translator circuit 100 incorporating the differential pair of the present invention is shown in FIG. 2. The illustrated circuit is designed to translate from ECL voltage levels to Three-Diode Buffered FET Logic (BFL) voltage levels. One skilled in the art could, however, without undue experimentation, modify the illustrated circuit to adapt it for level translation between any other logic families by selecting the supply voltages and the level shifting circuitry accordingly.

Inputs 102a and 102b of translator 100 provide differential input signals to a differential amplifier circuit 104. Amplifier 104 comprises two depletion mode GaAsFETs 106a and 106b. The differential output signals from the drains 107a and 107b of GaAsFETs 106a and 106b are provided to two level shifting circuits 108a and 108b. The outputs 110a and 110b from level shifting circuits 108a and 108b provide the GaAs compatible logic levels which are to be connected to the subsequent stages.

Connected across outputs 110a and 110b of level shifting circuits 108a and 108b is a sampling circuit 112, which continuously derives the common mode or internal GaAs reference signal from the differential output signals. The common mode signal can be further level shifted, as described later, to provide an error signal. This common mode or error signal is coupled back to a current source 114, which is responsive to the common mode signal to vary the current flow through respective GaAsFETs 106a and 106b of differential amplifier 104. By regulating the current through GaAsFETs 106a and 106b in accordance with the variations in the common mode signal, the symmetrical swings of the differential output signals about the internal GaAs reference voltage can be maintained and variations of the reference voltage can be minimized. That error signal may then be characterized as being a "true" common mode signal, in that its origin from the differential sampling circuit 112 permits it to maintain phase and amplitude matching in the output signals.

The error signal can also be fed to current sources 116a and 116b, which control the current passing through level shifting circuits 108a and 108b. This feedback system will compensate for non-linearities which are introduced in the output signals by the voltage compression effects of level shifting circuits 108a and 108b.

Differential Amplifier

Differential amplifier 104 is comprised of two depletion mode GaAsFETs 106a and 106b connected in a common source configuration. In other embodiments, enhancement-depletion mode GaAsFETs could be used. Current source 114 is connected between the common source terminals of GaAsFETs 106a and 106b and a $V_{SS}$ supply 118 of −3.0 volts. Current source 114 includes a GaAsFET having its drain tied to the common source terminals of GaAsFETs 106a and 106b, and having its source terminal coupled to $V_{SS}$ supply 118. Current flow from GaAsFET 114 is adjustably responsive to a control signal applied to its gate. In a preferred embodiment, a voltage source 120 is connected between the source of GaAsFET 114 and $V_{SS}$ supply 118. Voltage source 120 allows the voltage on the gate of GaAsFET 114 to be forced below the voltage on its source, thereby increasing the dynamic range of output current available from current source 114. Voltage source 120 comprises a GaAs diode with its anode connected to the source of GaAsFET 114 and with its cathode connected to $V_{SS}$ supply 118.

Since the output current from GaAsFET 114 is determined by its gate to source voltage, it is important that the voltage on the source terminal be carefully controlled. If variations in the voltage of $V_{SS}$ supply 118 are anticipated, then voltage source 120 may be replaced by a current source 121 that isolates the source of GaAsFET 114 from $V_{SS}$ supply 118.

Figure 3:
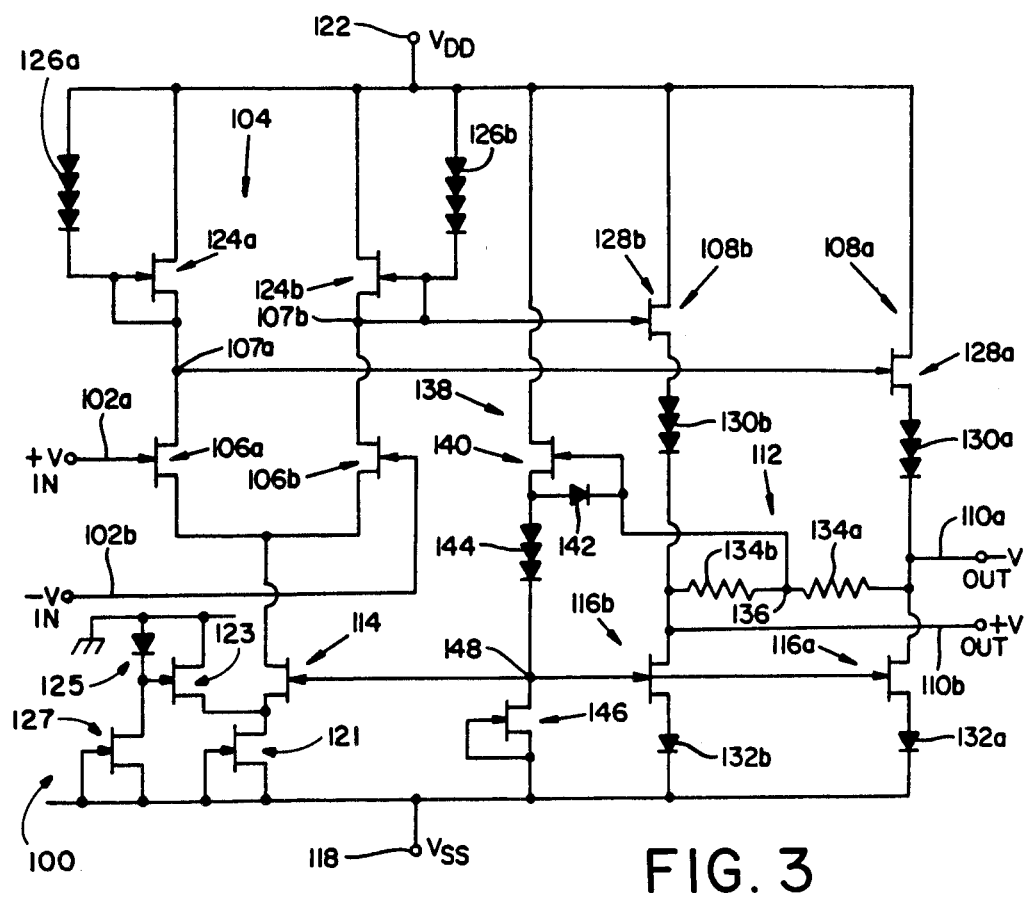
FIG. 3 is a schematic diagram of an alternative embodiment of a compensated differential GaAsFET input translator circuit having an isolating current source.

Such an isolating current source, as show in FIG. 3, can comprise a second GaAsFET 123 having its source connected to the source of GaAsFET 114 and having its drain tied to ground. The gate of the second GaAsFET 123 is connected to a voltage source referenced to ground, such as a series diode string 125 comprised of four GaAs diodes. This gate is further coupled to $V_{SS}$ supply 118 through a high impedance current source, such as through the drain of a third GaAsFET 127 with its gate and source tied to the $V_{SS}$ supply. The common source terminals of the second GaAsFET 123 and GaAsFET 114 is coupled to $V_{SS}$ through a similar high impedance current source 121. By isolating current source 114 from $V_{SS}$, and instead biasing it against ground, amplifier 104 is made relatively immune to variations in the $V_{SS}$ supply voltage. Similar circuits can be substituted for the other variable current sources described later.

In still other embodiments, voltage source 120 may be omitted, with only some sacrifice in the range of control over current source 114.

The drains 107a and 107b of GaAsFETs 106a and 106b are each connected to a $V_{DD}$ supply 122 of 4.0 volts through voltage dropping means 124a and 124b. Voltage dropping means 124a and 124b comprise GaAsFETs configured as active loads, with their gates tied to their sources. The sources of active loads 124a and 124b are tied to drains 107a and 107b of GaAsFETs 106a and 106b. The drains of active loads 124a and 124b are tied to $V_{DD}$ supply 122. Alternatively, voltage dropping means 124a and 124b may comprise passive elements, such as resistors, rather than the illustrated active loads.

Drains 107a and 107b of GaAsFETs 106a an 106b are each connected to $V_{DD}$ supply 122 through series diodes strings 126a and 126b. Series diode strings 126a and 126b serve to clamp the voltage dropped across voltage dropping means 124a and 124b below a predetermined value so that an excessively large signal applied to inputs 102a and 102b will not disable amplifier 104. As shown in FIG. 2, series diode strings 126a and 126b each comprise four GaAs diodes, but other embodiments, using different voltage levels, may require a different number of series diodes. In still other embodiments, diode strings 126a and 126b can be omitted altogether.

The ratios of gate widths of the component GaAsFETs are important to proper operation of amplifier 104. In one example of the preferred embodiment, the gate widths of active load GaAsFETs 124a and 124b are each ten microns. The gate width of current source GaAsFET 114 is twice the gate width of active load GaAsFETs 124a and 124b, or 20 microns. Such design yields a current density in current source 114 equal to the current density through each of the voltage dropping means 124a and 124b. The gate width of differential GaAsFETs 106a and 106b can be from one to approximately eight times the active load gate width.

The differential output signals from differential amplifier 104 are taken from drain terminals 107a and 107b of GaAsFETs 106a and 106b.

In some applications, it may be desirable to cascade a second differential amplifier stage, similar to the first, on the outputs of amplifier 104. Such a cascaded amplifier could, for example, provide additional gain so that the translator circuit could be used with smaller input signals.

Level Shifting Circuit

In the illustrated ECL to Three-Diode Buffered FET Logic translator circuit, coupling or level shifting circuits 108a and 108b shift the voltages provided at differential outputs 107a and 107b of amplifier 104 down to the desired, GaAs compatible output levels and couple these signals to output terminals 110. To facilitate description, the operation of only one level shifting circuit 108a will be described with reference to a specific example.

In the example, the output signal on drain 107a of GaAsFET 106a swings between approximately 0.5 volts and 3.5 volts. This 3 volt swing is converted to the approximately 2 volt swing needed at translator output terminal 110a by operation of a GaAsFET 128a.

The drain of GaAsFET 128a is tied directly to $V_{DD}$ supply 122. The gate of GaAsFET 128a is connected to drain 107a of GaAsFET 106a. The source terminal of GaAsFET 128a is connected to a series diode string 130a, here comprised of three GaAs diodes. Translator circuits for translating logic levels between other logic families may require a greater or lesser number of such diodes, depending on the amount of level shift required.

The input voltage swing from 0.5 to 3.5 volts on the gate of GaAsFET 128a produces a reduced output voltage swing, for example, from 0.9 volts to 2.9 volts on its source. These voltages at the source of GaAsFET 128a are level shifted down three GaAs diode forward voltage drops by series diode string 130a. The amount of this forward voltage drop is approximately 0.8 volts per diode junction, but can be varied about this point by varying the current flow through the diode string. The translated output signal on output terminal 110a will typically swing from −1.5 volts to +0.5 volts.

The current drawn through GaAsFET 128a and diode string 130a is set by current source 116a. Current source 116a is, in the preferred embodiment, a GaAsFET having its drain connected to output terminal 110a and having its source coupled to $V_{SS}$ supply 118. The current delivered by GaAsFET 116a is dependent on the voltage applied to its gate terminal. In the preferred embodiment, this gate voltage is varied in response to variations in the common mode signal, as described later, thereby compensating for the non-linearities introduced by level shifting circuits 108a. The source of GaAsFET 116a is coupled to $V_{SS}$ supply 118 through a forward-biased GaAs diode 132a. GaAs diode 132a serves as a voltage source which keeps the source of GaAsFET 116a approximately 0.8 volts above the $V_{SS}$ supply voltage. By raising the source of GaAsFET 116a above $V_{SS}$, its output current may be varied over a larger range.

In an alternative embodiment (not shown), current sources 116a and 116b can supply a fixed, rather than a variable, current to level shifting circuits 108a and 108b. The output from differential amplifier 104 would still be stabilized against temperature and process variations, but level shifting circuits 108a and 108b would not be compensated for voltage compression effects. Such effects, however, are minimal and may be ignored in many applications. In other embodiments, voltage sources 132a and 132b can be omitted, with only some sacrifice in the range of control of the output current from current sources 116a and 116b.

In the broader concept of the present invention, i.e., the GaAs differential amplifier with closed loop bias stabilization, level shifting circuits 108a and 108b described above are not necessary. Instead, the sampling circuit, described below, can be coupled directly to the differential amplifier outputs 107a and 107b.

Although the illustrated embodiment shows a diode-based level shifting circuit, other embodiments may employ batteries or voltage dividers to effect the same function. If maximum system speed is desired, the level shifting circuitry can be omitted and the proper output voltage levels can be obtained by selecting the appropriate $V_{SS}$ and $V_{DD}$ supply voltages.

Sampling Circuit

The differential output voltages at output terminals 110a and 110b, should, in an ideal differential system, provide equal and opposite voltage swings about a common mode voltage level. In the illustrated ECL to Three-Diode Buffered FET Logic translator circuit, the output voltages on output terminals 110a and 110b swing plus and minus 1 volt, to −1.5 and +0.5 volts, about a GaAs reference level of −0.05 volts. Sampling circuit 112 continuously derives this GaAs reference, or common mode voltage from the differential output voltages provided on output terminals 110a and 110b and makes this common mode signal available for feedback compensation of the translator's various current sources. By regulating the current through these current sources in accordance with the variations in the common mode signal, the symmetrical nature of the differential ouptut signals is maintained.

In the preferred embodiment, sampling circuit 112 comprises two matched passive components, such as 5 kilohm resistors 134a and 134b, connected in series across output terminals 110a and 110b. The common mode signal is provided at their common junction 136. The gain of the active feedback loop is increased as the values of resistors 134a and 134b are decreased. Alternatively, any circuit that provides a summation of the signals present on output terminals 110a and 110b could be substituted for the illustrated sampling circuit. For example, two GaAsFET active loads symmetrically connected together, with the common mode signal provided at their common junction, could be used.

As noted above, in the broader concept of the invention, i.e., the GaAs differential amplifier with closed loop bias stabilization, sampling circuit 112 can be coupled across drains 107a and 107b of the differential amplifier GaAsFETs 106a and 106b, rather than across the outputs from level shifter circuits 108a and 108b.

Feedback Circuit

In the illustrated embodiment, the common mode signal at junction 136 is level shifted by a coupling circuit 138 before being fed back to the control gates of the various current sources. The level of the resultant control, or error signal, is chosen to correspond to the particular current sources being used. For example, adding 0.8 volt voltage source 120 in series with current source 14 dictates that the nominal level of the error signal be increased approximately 0.8 volts, to −2.1 volts, to best exploit the increased dynamic range of the current source.

Level shifting circuit 138 is, in the illustrated embodiment, similar to level shifting circuits 108a and 108b. The common mode signal from terminal 136 of sampling circuit 112 is applied to the gate of a GaAsFET 140 configured as a source follower. The drain of GaAsFET 140 is tied to $V_{DD}$ supply 122. GaAsFET 140 couples the steady state component of the common mode signal back to the control gate inputs of the current sources. A back-biased GaAs diode 142 is connected between the gate and the source of GaAsGET 140 to capacitively couple any transient component of the common mode signal back to the control gates of the various current sources and to thereby speed up compensation of the system. Other passive bypass components may alternatively be used to shunt high speed transients around GaAsFET 140.

The source of GaAsFET 140 is connected to a forward biased series diode string 144. Diode string 144 here includes three GaAs diodes, but may include a lesser or greater number, depending on the various voltage levels being used. The opposite end of series diode string 144 is connected to the drain of a GaAsFET 146 configured as a current source, with its gate tied to its source and to $V_{SS}$ supply 118.

In other embodiments, the level shifting circuit between sampling circuit 112 and the control gates of the various current sources may comprise a series-connected battery or a voltage divider circuit, or it may be omitted entirely. Since the maximum operating speed of the system is limited by the response time of the feedbck circuity, it is advantageous to keep this circuitry as simple as possible.

The error voltage provided at the junction 148 of diode string 144 and the drain of GaAsFET 140 is applied to the gates of current sources 114, 116a and 116b. This voltage is approximately equal to the common mode voltage from the outputs of differential amplifier 104, stepped down six diode voltage drops. Any variations in the amplifier's common mode signal, however, are directly reflected in this voltage.

In some applications, it might be desirable to provide an amplifier stage in the feedback circuit to amplify the compensation signal. This would provide better control of the various current sources at the expense of system speed.

If the error signal provided at junction 148 rises above a desired reference level, current source 114 will provide more current to differential amplifier 104, thereby increasing the amplitude of the voltage swings on drains 107a and 107b. Conversely, if the error signal drops below the desired level, current source 116 will provide less current to differential amplifier 104, thereby decreasing the amplitude of the voltage swings on drains 107a and 107b.

The error signal at junction 148 also serves to compensate for non-linearities caused by varying the voltages across diode strings 130a and 130b. When the error signal at junction 148 goes up, current sources 116a and 116b draw more current through diode strings 130a and 130b, thereby increasing slightly the voltage dropped across these strings. Likewise, when the error signal drops, current sources 116a and 116b draw less current through diode strings 130a and 130b, thereby decreasing slightly the voltage dropped across these strings.

Operation

Inputs 102 and outputs 110 of level translator circuit 100 can each be used differentially or single-endedly. To use inputs 102 and/or outputs 110 differentially, the input and/or output terminals are connected directly to the corresponding input logic or GaAs circuitry. The differential outputs provide phase and amplitude matched signals which are necessary to properly drive balanced circuitry.

If input 102 is to be driven single-endedly, the appropriate input signal is applied to one of terminals 102a or 102b and the appropriate reference voltage is applied to the other. The reference voltage allows the translator circuit to track that particular family of input logic.

If output 110 is to be used single-endedly, a GaAs compatible output signal can be taken from either terminal 110a or 110b and will be referenced to the circuit's internal GaAs logic levels.

The circuit can be used with a single-ended input and a differential output, or vice versa. If either the input or the output is used single-endedly, the circuit can be used to provide an inverting or non-inverting function, depending on which input or output terminal is used.

Although the compensated differential amplifier of the present invention will be used primarily in integrated circuit form, the invention can also be practiced using discrete components. The need for such a compensated circuit is even greater with discrete components than with integrated circuits due to the greater processing variations inherent in discrete components.

Figure 4:
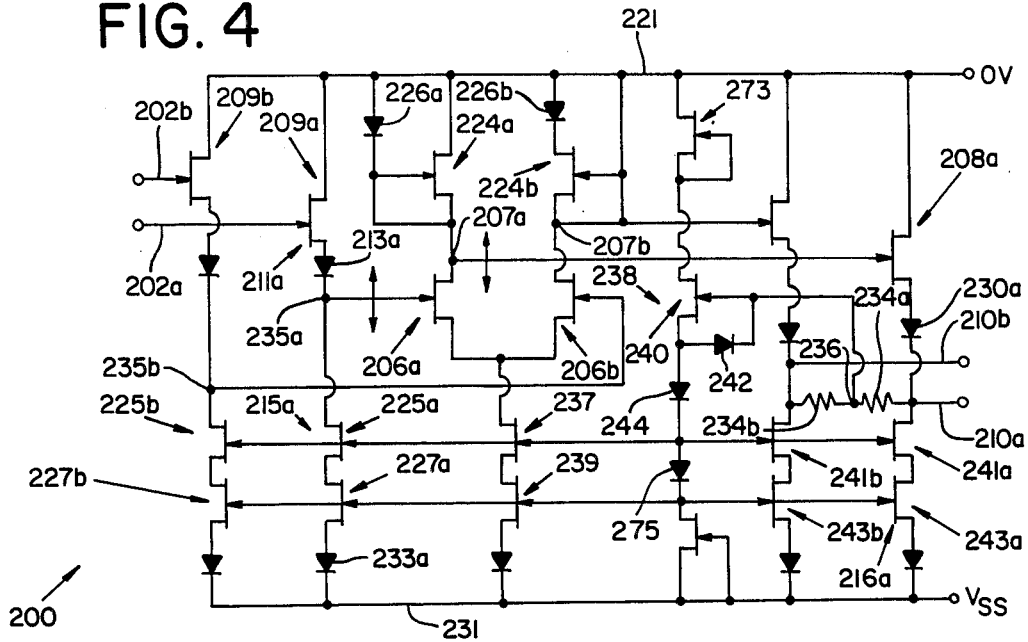
FIG. 4 is a schematic diagram of a GaAsFET input buffer circuit incorporating one form of compensated differential amplifier according to the present invention.
Figure 5:
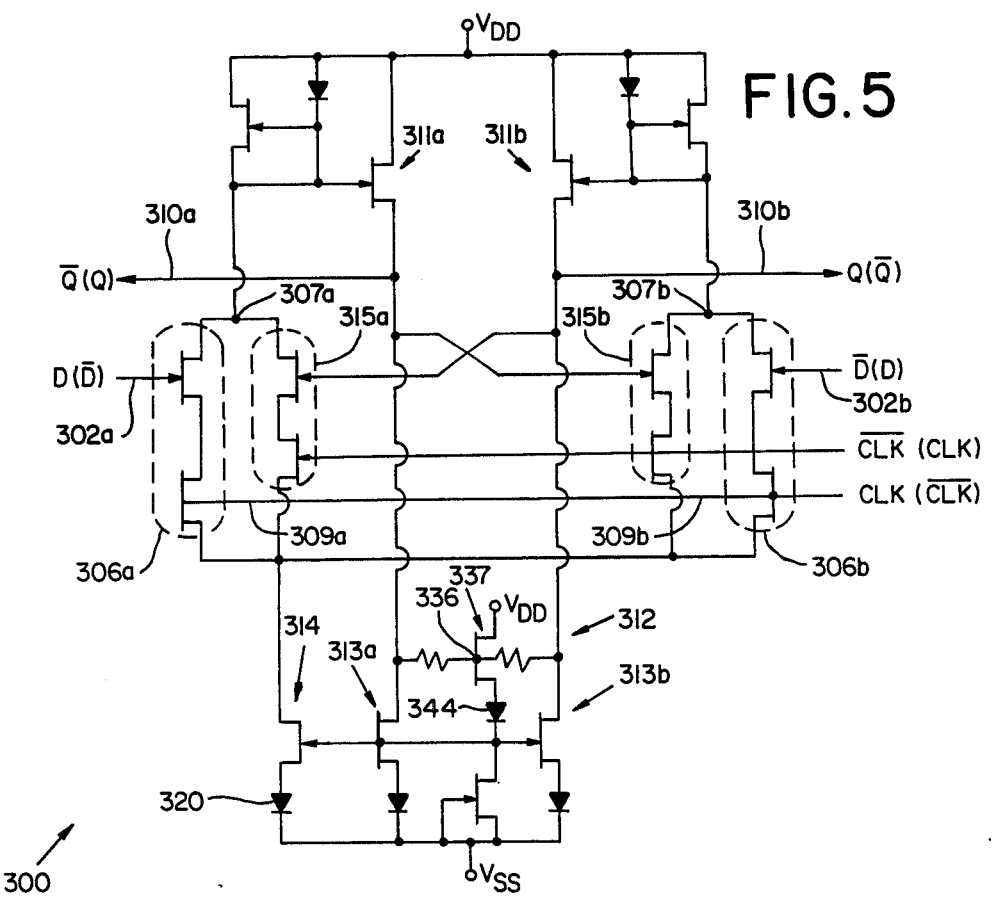
FIG. 5 is a schematic diagram of a GaAsFET flip-flop circuit incorporating another form of compensated differential amplifier according to the present invention.

The compensated differential amplifier of the present invention, described above as an element of a level translator circuit, can be incorporated into a variety of other circuits. FIG. 4 shows the compensated differential pair incorporated into another input buffer circuit. FIG. 5 shows a variation of the present invention incorporated into a flip-flop. A brief description of these applications follows.

Input Buffer Circuit

The circuit of FIG. 4 shows the compensated differential amplifier of the present invention used as part of an input buffer stage 200 and illustrates use of the amplifier with a different set of supply voltages, i.e., 0 and −15 volts.

The differential inputs 202a and 202b of buffer 200 are coupled to the gates of the differential amplifier GaAsFETs 206a and 206b through input level shifting circuits 209a and 209b. Each such level shifting circuit is similar in construction to those described above. For example, level shifting circuit 209a comprises a GaAsFET 211a, a series diode string 213a and a current source 215a. Diode string 213a includes five GaAs diodes. Current source 215a here comprises two stacked GaAsFETs 225a and 227a. The two stacked GaAsFETs present a higher impedance looking down into the current source than a single GaAsFET, thereby providing a higher common mode rejection ratio for the circuit. Current source GaAsFETs 225a and 227a are both controlled by the common mode feedback signal. The source of GaAsFET 227a is held above the $V_{SS}$ supply 231 of −15 volts by a GaAs diode 233a acting as voltage source.

The outputs 235a and 235b from input level shifting circuits 209a and 209b are provided to the gates of the differential amplifier GaAsFETs 206a and 206b. Differential amplifier 204 is similar to differential amplifier 104 of FIG. 2 but uses two stacked GaAsFETs 237 and 239 as a current source. The clamp diode strings 226a and 226b across the active loads 224a and 224b again comprise four GaAs diodes, although for simplicity FIG. 4 shows only one.

Each output from differential amplifier 204, such as 207a, is connected to a level shifting circuit, such as 208a, similar to level shifting circuit 108a of FIG. 2. The diode string 230a used in level shifting circuit 208a, however, comprises nine GaAs diodes, instead of the three shown in FIG. 2. The current source 216a biasing level shifting circuit 208a comprises two stacked GaAsFETs 241a and 243a, instead of the one shown in FIG. 2. Output 210a of buffer circuit 200 is provided at the junction of diode string 230a and current source 216a.

An ECL signal applied to inputs 202 of buffer 200, switching between −0.8 and −1.8 volts, will produce a signal on the gates of differential amplifier GaAsFETs 206 switching between −4.8 and −5.8 volts. Outputs 207 of differential amplifier 204 will, in response, switch between −0.8 and −2.8 volts. After level shifting by circuit 208, buffer output terminals 210 provide output signals, compatible with the next GaAs stage, switching between −7 and −9 volts.

Sampling circuit 212, similar to sampling circuit 112 of FIG. 2, comprises a pair of resistors 234a and 234b coupled across output terminals 210. A true common mode signal, corresponding to the common mode level of the differential output signals, is provided at the junction 236 of resistors 234. This signal is fed back, through level shifting circuit 238, to the control gates of the various current sources.

Level shifting circuit 238 is similar to level shifting circuit 138 of FIG. 2. The feedback coupling of the steady state component of the common mode signal is effected through a GaAsFET 240. The transient component of the common mode signal is coupled through a passive capacitance element, here a back-biased GaAs diode 242, shunting GaAsFET 240. The drain of GaAsFET 240 is biased to a $V_{DD}$ supply 221 of 0 volts through an active load 273. The source of GaAsFET 240 is coupled to the control gates of the first tier of current sources, 225a, 225b, 237, 241a and 241b, through a diode string 244 composed of two GaAs diodes. The source of GaAsFET 240 is coupled to the control gates of the second tier of current sources, 227a, 227b, 239, 243a and 243b, through an additional diode string 275 composed of seven GaAs diodes. The voltage on the first tier of control gates is nominally −9.3 volts. The voltage on the second tier is −14.3 volts.

The buffer's compensated output signals are used to drive the D and not D inputs of a GaAs differential flip-flop, described below.

Flip-Flop Circuit

Although the above applications of the present invention show a pair of single gate GaAsFETs in the differential amplifier, it may at times be advantageous to employ dual gate GaAsFETs. Such an application, a flip-flop circuit 300, is shown in FIG. 5.

Differential input signals are applied to flip-flop 300 through D inputs 302a and 302b, which are connected to the first gates of dual gate GaAsFETs 306a and 306b. The second gates 309a and 309b are connected to a differential clock source which clocks the flip-flop. The common sources of GaAsFETs 306a and 306b are connected to a current source 314 which is in series with a voltage source 320.

Drain outputs 307a and 307b of GaAsFETs 306a and 306b are coupled to the sampling circuit 312 and to output terminals 310a and 310b through output switching GaAsFETs 311a and 311b. Output switching GaAsFETs 311a and 311b are biased by independent current sources 313a and 313b which are responsive to the common mode signal. The common mode output terminal 336 of sampling circuit 312 is coupled to the control gates of current sources 314, 313a and 313b through a GaAsFET 337 configured as a source follower and through a diode string 344 comprised of three GaAs diodes.

The seond pair of dual gate GaAsFETs 315a and 315b provide the flip-flop's memory and latching functions.

Having described and illustrated the principles of my invention with reference to a preferred embodiment and several applications and variations thereof, it should be apparent to those skilled in the art that the invention may be modified in arrangement and detail without departing from such principles. I claim all modifications coming within the scope and spirit of the following claims.

I claim:

1. A gallium arsenide (GaAs) differential voltage amplifier, compensated for temperature and process variations, comprising:
    signal input means for inputting an input logic signal;
    signal output means for outputting an output logic signal;
    a common source gallium arsenide field effect transistor (GaAsFET) differential amplifier comprising a pair of common source connected GaAsFETS, each having a drain coupled to a voltage input through a voltage dropping means, each GaAsFET having a gate input and a drain output, said gate inputs being coupled to the signal input means and the drain outputs providing output differential logic signals;

the GaAsFET differential amplifier further including a current source means connected to the common source of the GaAsFETs for producing current flow through the GaAsFETs and the voltage dropping means, the current source means being adjustably responsive to a signal applied to a control signal input of the current source means to vary said current flow;

first coupling means for coupling the differential logic signals from the GaAsFET drains to the signal output means;

sampling means coupled to the GaAsFET drains for generating a true common mode signal from the differential logic signal; and second coupling means for coupling the true common mode signal to the control signal input of the current source.

2. An amplifier according to claim 1 in which the current source is connected in series with a voltage source and the second coupling means includes a voltage shifting means for shifting the voltage of the true common mode signal, whereby the dynamic range of the current source is enhanced.

3. An amplifier according to claim 1 in which the second coupling means includes an active means, for coupling a steady state component of the true common mode signal, shunted by a passive means, for coupling a transient component of the common mode signal.

4. An amplifier according to claim 1 in which the sampling means includes two active components symmetrically connected together and providing the common mode signal at a common junction.

5. An amplifier according to claim 1 in which a voltage source is connected in series with the current source.

6. An amplifier according to claim 1 in which the second coupling means includes a voltage shifting means for shifting the voltage of the true common mode signal.

7. An amplifier according to claim 1 in which the sampling means includes two passive components symmetrically connected together and providing the common mode signal at their junction.

8. A gallium arsenide (GaAs) translator circuit according to claim 1 for translating an input logic signal, input from a first circuit at a first set of logic levels, for output of a second set of logic levels, in which the first coupling means couples the differential logic signals from the GaAsFET drains to the signal ouptut means at the second set of logic levels.

9. A translator according to claim 8 in which the sampling means includes two passive components symmetrically connected together and providing the common mode signal at their junction.

10. A translator according to claim 8 in which the sampling means includes two active components symmetrically connected together and providing the common mode signal at a common junction.

11. A translator according to claim 8 in which a voltage source is connected in series with the current source.

12. A translator according to claim 8 in which the first coupling means includes a second GaAsFET differential voltage amplifier.

13. A translator according to claim 8 in which the first coupling means includes a first voltage shifting means for shifting the voltage of the differential logic signals from the GaAsFET drains.

14. A translator according to claim 13 in which the first voltage shifting means includes a current source having an output current responsive to the true common mode signal.

15. A translator according to claim 8 in which the second coupling means includes a second voltage shifting means for shifting the voltage of the true common mode signal.

16. A translator according to claim 8 in which the second coupling means includes an active means, for coupling a steady state component of the true common mode signal, shunted by a passive means, for coupling a transient component of the true common mode signal.

17. A method for compensating a gallium arsenide differential amplifier comprising:

providing a differential common source amplifier including a pair of common source connected gallium arsenide FETs (GaAsFETs), each having a drain coupled to an input voltage source through a means for dropping voltage, and also having a gate input, the amplifier further including a variable current source connected to said common source of said GaAsFETs and having adjustment means for varying output current through the current source, the GaASFETs and the voltage dropping means;

applying a logic signal to the GaAsFET gates;

extracting a pair of differential output signals from the GaAsFET drains;

deriving a true common mode signal from the differential output signals;

coupling the true common mode signal back to the adjustment means of the differential amplifier current source; and varying the output of the current source to minimize variations of the true common mode signal and to maintain phase and amplitude matched differential output signals relative to their common mode level.

18. The method of claim 17 including clamping the voltage dropped across each voltage dropping means to prevent said voltage from increasing above a predetermined value.

19. The method of claim 17 including shifting the level of the true common mode signal while coupling it back to the adjustment means of the differential amplifier current source.

* * * * *